(12) United States Patent
Sugimoto

(10) Patent No.: US 7,998,560 B2
(45) Date of Patent: Aug. 16, 2011

(54) MULTILAYER CERAMIC SUBSTRATE, METHOD FOR PRODUCING SAME, AND ELECTRONIC COMPONENT

(75) Inventor: Yasutaka Sugimoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/266,574

(22) Filed: Nov. 7, 2008

(65) Prior Publication Data
US 2009/0061178 A1   Mar. 5, 2009

Related U.S. Application Data

(63) Continuation of application No. PCT/JP2008/055495, filed on Mar. 25, 2008.

(30) Foreign Application Priority Data
Apr. 20, 2007 (JP) .................. 2007-111189

(51) Int. Cl.
*B32B 9/00* (2006.01)

(52) U.S. Cl. ........ 428/210; 428/209; 174/255; 174/257; 174/258; 361/746; 361/760

(58) Field of Classification Search .......... 428/209–210; 174/255, 257–258; 361/746, 760
See application file for complete search history.

(56) References Cited

U.S. PATENT DOCUMENTS

| | | | |
|---|---|---|---|
| 4,894,115 A * | 1/1990 | Eichelberger et al. | 134/1.1 |
| 5,456,778 A * | 10/1995 | Fukuta et al. | 156/89.17 |
| 5,549,778 A | 8/1996 | Yokoyama et al. | |
| 5,855,711 A * | 1/1999 | Araki et al. | 156/89.16 |
| 5,998,314 A * | 12/1999 | Sugimoto | 501/32 |
| 6,150,725 A * | 11/2000 | Misawa et al. | 257/781 |
| 6,219,912 B1 * | 4/2001 | Shimizu et al. | 29/846 |
| 6,228,196 B1 * | 5/2001 | Sakamoto et al. | 156/89.17 |
| 6,231,986 B1 * | 5/2001 | Sugimoto et al. | 428/426 |
| 6,324,068 B1 * | 11/2001 | Shimizu et al. | 361/777 |
| 6,376,055 B1 * | 4/2002 | Kishida et al. | 428/210 |
| 6,395,118 B1 * | 5/2002 | Sakamoto et al. | 156/89.12 |
| 6,448,195 B2 * | 9/2002 | Kishida et al. | 501/32 |

(Continued)

FOREIGN PATENT DOCUMENTS

JP      05-102666      * 4/1993

(Continued)

OTHER PUBLICATIONS

Official Communication issued in International Patent Application No. PCT/JP2008/055495, mailed on Apr. 22, 2008.

(Continued)

*Primary Examiner* — Cathy Lam
(74) *Attorney, Agent, or Firm* — Keating & Bennett, LLP

(57) ABSTRACT

A multilayer ceramic substrate includes an inner layer portion and surface portions that sandwich the inner layer portion in the stacking direction and have an increased transverse strength because of the surface layer portion having a thermal expansion coefficient less than that of the inner layer portion. At least one of the surface portions covers peripheries of main-surface conductive films arranged on a main surface of an inner portion so as to leave central portions of the main-surface conductive films exposed, so that the main-surface conductive films function as via conductors, thereby eliminating the need to provide a via conductor in the surface portions.

6 Claims, 1 Drawing Sheet

U.S. PATENT DOCUMENTS

| | | | | |
|---|---|---|---|---|
| 6,472,074 | B2 * | 10/2002 | Sugimoto | 428/432 |
| 6,503,645 | B1 * | 1/2003 | Taira et al. | 428/699 |
| 6,551,427 | B2 * | 4/2003 | Sakamoto et al. | 156/89.12 |
| 6,610,621 | B2 * | 8/2003 | Masuko | 501/32 |
| 6,776,862 | B2 * | 8/2004 | Sakamoto | 156/89.12 |
| 6,797,093 | B2 * | 9/2004 | Moriya et al. | 156/89.12 |
| 6,811,635 | B2 * | 11/2004 | Sakamoto et al. | 156/89.16 |

FOREIGN PATENT DOCUMENTS

| | | |
|---|---|---|
| JP | 5-315720 A | 11/1993 |
| JP | 06-29664 A | 2/1994 |
| JP | 10-194828 A | 7/1998 |
| JP | 11-17334 A | 1/1999 |
| JP | 2002-252461 A | 9/2002 |
| JP | 2007-73728 A | 3/2007 |

OTHER PUBLICATIONS

Sugimoto, "Multilayer Ceramic Substrate, Method for Producing Same, and Electronic Componet" U.S. Appl. No. 12/539,629, filed Aug. 12, 2009.

Official Communication issued in corresponding U.S. Appl. No. 12/539,629, mailed on Mar. 18, 2010.

Official Communication issued in corresponding Japanese Patent Application No. 2008-534799, mailed on Apr. 5, 2011.

* cited by examiner

MULTILAYER CERAMIC SUBSTRATE, METHOD FOR PRODUCING SAME, AND ELECTRONIC COMPONENT

BACKGROUND OF THE INVENTION

1. Field of the Invention

The present invention relates to a multilayer ceramic substrate, a method for producing a multilayer ceramic substrate, and an electronic component including a multilayer ceramic substrate. In particular, the present invention relates to a multilayer ceramic substrate having a laminated structure including surface portions and an inner layer portion, in which each of the surface portions has a thermal expansion coefficient less than that of the inner portion, so that the multilayer ceramic substrate has improved strength.

2. Description of the Related Art

A multilayer ceramic substrate is described in, for example, Japanese Unexamined Patent Application Publication No. 6-29664. Japanese Unexamined Patent Application Publication No. 6-29664 discloses a low-temperature co-fired multilayer ceramic substrate including glass and a crystalline material, in which surface portions have a thermal expansion coefficient less than that of an inner layer portion, and in which the total thickness of the surface portions arranged on both sides thereof is less than the thickness of the inner layer portion. Japanese Unexamined Patent Application Publication No. 6-29664 discloses that the use of such a structure generates compressive stresses in both surface portions during a cooling step after firing, thereby improving the transverse strength of the multilayer ceramic substrate.

The inventor of the present invention discovered that when a glass-ceramic material including an MO—$SiO_2$—$Al_2O_3$—$B_2O_3$-based glass (wherein MO is at least one selected from CaO, MgO, SrO, and BaO) and an alumina powder is used as a material defining surface portions of a multilayer ceramic substrate as described above, the multilayer ceramic substrate has an improved transverse strength while having outstanding electrical properties.

However, the multilayer ceramic substrate includes conductive patterns having via conductors arranged so as to pass through the surface portions. It was discovered that when the via conductors arranged so as to pass through the surface portions are made of a low-resistivity Ag-based material and when the surface portions are made of a glass-ceramic material, Ag diffuses into the surface portions to form voids around the via conductors. It was also discovered that, in particular, when the glass-ceramic material including an MO—$SiO_2$—$Al_2O_3$—$B_2O_3$-based glass and the alumina powder is used, Ag readily diffuses into the surface portions.

SUMMARY OF THE INVENTION

To overcome the problems described above, preferred embodiments of the present invention provide a defect-free multilayer ceramic substrate having a high transverse strength even when a Ag-based material is used, a method for producing the multilayer ceramic substrate, and an electronic component including the multilayer ceramic substrate.

A preferred embodiment of the present invention provides a multilayer ceramic substrate having a laminated structure including an inner layer portion and surface portions that are in contact with main surfaces of the inner layer portion, the inner layer portion being arranged between the surface portions in the stacking direction, in which the surface portions have a thermal expansion coefficient less than that of the inner layer portion, the surface portions are made of a glass-ceramic material including glass and a ceramic powder, and the inner layer portion includes a conductive pattern made of a Ag-based material. To overcome the problems described above, the conductive pattern preferably includes main-surface conductive films arranged on one or both of the main surfaces of the inner layer portion, and at least one of the surface portions covers peripheries of the main-surface conductive films so as to leave a central portion of the main-surface conductive films exposed.

More specifically, preferred embodiments of the present invention are particularly advantageously applied when the glass-ceramic material defining the surface portions includes an MO—$SiO_2$—$Al_2O_3$—$B_2O_3$-based glass, where MO represents at least one selected from CaO, MgO, SrO, and BaO, and an alumina powder.

Preferably, the difference in thermal expansion coefficient between the inner layer portion and the surface portions is at least about 1.0 ppmK$^{-1}$, and the content of a component common to both a material defining the inner layer portion and a material defining the surface portions is at least about 75% by weight. In this case, more preferably, the difference in thermal expansion coefficient between the inner layer portion and the surface portions is about 4.3 ppmK$^{-1}$ or less.

In the multilayer ceramic substrate according to a preferred embodiment of the present invention, the glass included in the material defining the surface portions preferably includes about 34% to about 73% by weight of $SiO_2$, about 14% to about 41% by weight of MO, about 0% to about 30% by weight of $Al_2O_3$, and about 0% to about 30% by weight of $B_2O_3$, for example.

In a method for the multilayer ceramic substrate according to a preferred embodiment of the present invention, a glass-ceramic paste including glass and a ceramic powder is prepared. A plurality of inner ceramic green sheets for forming inner layers are prepared. A conductive pattern made of an Ag-based material is formed on a specific sheet of the plurality of inner ceramic green sheets.

Next, a step of forming a laminate including an inner layer portion and surface portions is performed, the inner layer portion being formed by stacking the plurality of inner ceramic green sheets, and the surface portions being formed by applying the glass-ceramic paste to outward facing surfaces of the outermost sheets of the inner ceramic green sheets defining the inner layer portion. A step of firing the laminate is then performed.

In the method for producing the multilayer ceramic substrate according to preferred embodiments of the present invention, the foregoing conductive pattern preferably includes main-surface conductive films formed on one or both of the outward facing surfaces of the outermost sheets of the inner ceramic green sheets defining the inner layer portion, and at least one of the surface portions of the laminate is formed so as to cover peripheries of the main-surface conductive films and to expose a central portion of the main-surface conductive films.

The method for producing the multilayer ceramic substrate according to preferred embodiments of the present invention is particularly advantageously applied when the glass ceramic paste includes an MO—$SiO_2$—$Al_2O_3$—$B_2O_3$-based glass (wherein MO represents at least one selected from CaO, MgO, SrO, and BaO) and an alumina powder.

Preferably, the method for producing the multilayer ceramic substrate according to preferred embodiments of the present invention further includes the steps of preparing a constraining ceramic green sheet, the constraining ceramic green sheet including an inorganic material that is not sintered at a temperature at which the glass-ceramic paste and the inner ceramic green sheets are sintered, and forming a composite laminate by arranging the constraining ceramic green sheet on at least one main surface of the laminate. In this case, in the step of firing the laminate, the laminate is fired at a temperature at which the glass-ceramic paste and the inner ceramic green sheets are sintered but at which the constraining ceramic green sheet is not sintered.

In the multilayer ceramic substrate according to preferred embodiments of the present invention, although the peripheries of the main-surface conductive films arranged on one or both of the main surfaces of the inner layer portion are covered with at least one of the surface portions, the central portions thereof are exposed. Thus, the main-surface conductive films provides a function substantially similar to that of the via conductors arranged in the at least one of the surface portions, thereby eliminating the need to form a via conductor in the surface portions. Even when the conductive pattern including the main-surface conductive films is made of the Ag-based material and the surface portions are made of the glass-ceramic material including glass and the ceramic powder, the defect-free multilayer ceramic substrate having a high transverse strength is produced. The reason for this is believed to be as follows. A low diffusion of Ag occurs in the surface portions due to a small contact area between the main-surface conductive films and the surface portions, and at least one of the surface portions is constrained by the constraining ceramic green sheet when what is a non-shrinkage process is performed with the constraining ceramic green sheet.

According to preferred embodiments of the present invention, even when the surface portions are made of the glass-ceramic material, in which Ag readily diffuses, containing a MO—$SiO_2$—$Al_2O_3$—$B_2O_3$-based glass and the alumina powder, the defect-free multilayer ceramic substrate having a high transverse strength is produced.

In the multilayer ceramic substrate according to preferred embodiments of the present invention, since the peripheries of the main-surface conductive films are covered with the at least one of the surface portions, the bond strength between the exposed main-surface conductive films and the multilayer ceramic substrate is increased.

In the multilayer ceramic substrate according to a preferred embodiment of the present invention, a difference in thermal expansion coefficient between the inner layer portion and the surface portions of at least about 1.0 $ppmK^{-1}$ effectively prevents warpage of the multilayer ceramic substrate. It is believed that the reason for this is that when the difference in thermal expansion coefficient is increased to at least about 1.0 $ppmK^{-1}$, warpage is corrected because an in-plane stress causing warpage of the multilayer ceramic substrate is less than the stresses acting on the front and back surfaces in the planar direction due to the difference in thermal expansion coefficient.

In the multilayer ceramic substrate according to preferred embodiments of the present invention, when the content of the component common to both of the material defining the surface portions and the material defining the inner layer portion is at least about 75% by weight, a sufficient bond strength is obtained between the surface portions and the inner layer portion. Thus, as described above, even when the difference in thermal expansion coefficient between the inner layer portion and the surface portions is at least about 1.0 $ppmK^{-1}$, the occurrence of defects, such as delamination and voids, for example, is prevented.

In the multilayer ceramic substrate according to a preferred embodiment of the present invention, when the difference in thermal expansion coefficient between the inner layer portion and the surface portions is about 4.3 $ppmK^{-1}$ or less, the occurrence of defects, such as delamination and voids, for example, due to the difference in thermal expansion coefficient is more reliably prevented.

In the method for producing the multilayer ceramic substrate according to a preferred embodiment of the present invention, in the step of forming the laminate, the glass-ceramic paste is applied so as to cover the peripheries of the main-surface conductive films and to expose the central portions of the main-surface conductive films, thereby forming the surface portions, and the main-surface conductive films function in substantially the same manner as the via conductors. Thus, there is no need for a step of forming a via conductor. For example, there is no need to perform the steps of preparing a green sheet defining the surface portion, forming through holes therein, and filling a conductive paste into the through holes. Therefore, the production process of the multilayer ceramic substrate is simplified.

In the method for producing the multilayer ceramic substrate according to a preferred embodiment of the present invention, the use of the constraining ceramic green sheet prevents shrinkage in the direction of the main surface during the firing of the laminate. As a result, undesired deformation of the multilayer ceramic substrate is prevented to thereby improve the dimensional accuracy. Furthermore, delamination between the inner layer portion and the surface portions is much less likely to occur during the firing.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 2A to 2C illustrate a multilayer ceramic substrate according to another preferred embodiment of the present invention and a method for producing the multilayer ceramic substrate, wherein FIGS. 2A and 2B are schematic cross-sectional views of states in the course of the production of the multilayer ceramic substrate, and FIG. 2C is a front elevational view of an electronic component including the multilayer ceramic substrate and is a cross-sectional view with respect to the multilayer ceramic substrate.

DETAILED DESCRIPTION OF PREFERRED EMBODIMENTS

Figure 1:
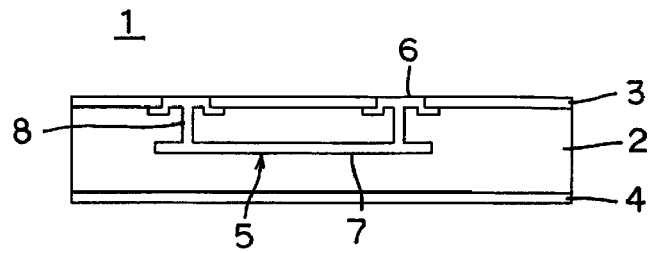
FIG. 1 is a schematic cross-sectional view of a multilayer ceramic substrate 1 according to a preferred embodiment of the present invention.

FIG. 1 is a schematic cross-sectional view of a multilayer ceramic substrate 1 according to a preferred embodiment of the present invention.

The multilayer ceramic substrate 1 has a laminated structure including an inner layer portion 2 and surface portions 3 and 4 which are in contact with main surfaces of the inner layer portion 2 and between which the inner layer portion 2 is arranged in the stacking direction. The inner layer portion 2 includes a conductive pattern 5 made of an Ag-based material. The conductive pattern 5 includes main-surface conductive films 6 arranged on one main surface of the inner layer portion 2, an inner conductive film 7 arranged in a central portion of the inner layer portion 2 in the thickness direction, and via conductors 8 arranged to connect the main-surface conductive films 6 and the inner conductive film 7. The surface portion 3 covers the periphery of each of the main-surface conductive films 6 while leaving the center of each main-surface conductive film 6 exposed. Thus, the main-surface conductive films 6 provides a function that is substantially the same as that of via conductors arranged in the surface portion 3. This eliminates the need to form a via conductor in the surface portion 3.

Among conductive films (not shown in FIG. 1) arranged on the main surfaces of the inner layer portion 2, if the conductive films provide only interconnections in the same plane and do not function as via conductors, the surface portions 3 and 4 preferably cover substantially all of the conductive films. That is, not all of the conductive films arranged on the main surfaces of the inner layer portion 2 are the "main-surface conductive films" as defined in preferred embodiments of the present invention.

The surface portion 3 preferably covers the periphery of each main-surface conductive film 6 as described above. Alternatively, the surface portion 3 may not entirely cover the periphery of each main-surface conductive film 6. That is, the surface portion 3 may partially cover the periphery of each main-surface conductive film 6.

In the multilayer ceramic substrate 1, the surface portions 3 and 4 have a thermal expansion coefficient less than that of the inner layer portion 2. Preferably, the difference in thermal expansion coefficient between the inner layer portion 2 and the surface portions 3 and 4 is at least about 1.0 ppmK$^{-1}$, for example. Furthermore, the content of a component common to both a material defining the surface portions 3 and 4 and a material defining the inner layer portion 2 is preferably at least about 75% by weight, for example.

This configuration provides a high transverse strength in the multilayer ceramic substrate 1, effectively prevents warpage of the multilayer ceramic substrate 1, and prevents the occurrence of defects, such as delamination and voids, for example, at interfaces between the inner layer portion 2 and the surface portions 3 and 4.

In particular, with respect to warpage, it was discovered that when using a method for applying an in-plane compressive stress to each of the surface portions 3 and 4 according to preferred embodiments of the present invention, a difference in thermal expansion coefficient between the inner layer portion 2 and the surface portions 3 and 4 of at least about 1.0 ppmK$^{-1}$ significantly reduces warpage of the multilayer ceramic substrate 1. That is, the relationship between the amount of curvature and the difference in thermal expansion coefficient was determined as follows. A difference in thermal expansion coefficient of less than about 1.0 ppmK$^{-1}$ produces a substantially constant amount of curvature, at a difference in thermal expansion coefficient at about 1.0 ppmK$^{-1}$, the amount of curvature is significantly changed to approximately zero, and a difference in thermal expansion coefficient of more than about 1.0 ppmK$^{-1}$ produces a substantially constant amount of curvature. It is believed that the reason for this is that warpage is corrected because an in-plane stress causing warpage of the multilayer ceramic substrate 1 is less than the stresses acting on the front and back surfaces in the planar direction caused by the difference in thermal expansion coefficient.

When a component is mounted on or a resin coating is formed on a surface of the multilayer ceramic substrate 1, the shrinkage of solder, an adhesive, or the coating resin disadvantageously causes warpage of the multilayer ceramic substrate 1. To overcome the problem, when using the method for applying an in-plane compressive stress to each of the surface portions 3 and 4, it was discovered that a difference in thermal expansion coefficient between the inner layer portion 2 and the surface portions 3 and 4 of at least about 1.0 ppmK$^{-1}$ significantly reduces warpage of the multilayer ceramic substrate 1. That is, the relationship between the amount of curvature and the difference in thermal expansion coefficient was determined to be as follows. At a difference in thermal expansion coefficient of less than about 1.0 ppmK$^{-1}$, the amount of curvature decreases with an increasing difference in thermal expansion coefficient, and a difference in thermal expansion coefficient of at least about 1.0 ppmK$^{-1}$ provides a substantially constant amount of curvature. In addition, it is believed that warpage is corrected because an in-plane stress causing warpage of the multilayer ceramic substrate 1 is less than the stresses acting on the surface portions in the planar direction attributed to the difference in thermal expansion coefficient.

The difference in thermal expansion coefficient between the inner layer portion 2 and the surface portions 3 and 4 is preferably about 4.3 ppmK$^{-1}$ or less, for example. This reliably prevents the occurrence of defects, such as delamination and voids, for example, at the interfaces between the inner layer portion 2 and the surface portions 3 and 4 due to the difference in thermal expansion coefficient.

The surface portions 3 and 4 are made of a glass-ceramic material containing glass and a ceramic powder. In a preferred embodiment of the present invention, the surface portions 3 and 4 are preferably made of a glass-ceramic material containing a MO—SiO$_2$—Al$_2$O$_3$—B$_2$O$_3$-based glass, for example, where MO represents at least one selected from CaO, MgO, SrO, and BaO, and an alumina powder as a filler. In this case, the weight ratio of SiO$_2$ to MO in the glass is preferably in the range of about 23:7 to about 17:13, for example. A material defining the inner layer portion 2 preferably includes glass including SiO$_2$ and MO, for example, in which the ratio of SiO$_2$ to MO is preferably in the range of about 19:11 to about 11:19, for example.

More preferably, glass included in the material defining the surface portions 3 and 4 has a SiO$_2$ content of about 34% to about 73% by weight, for example, and glass contained in the material defining the inner layer portion 2 has a SiO$_2$ content of about 22% to about 60% by weight, for example.

Such glass compositions described above are suitable for achieving a difference in thermal expansion coefficient between the inner layer portion 2 and the surface portions 3 and 4 of at least about 1.0 ppmK$^{-1}$ and for achieving a common component content of at least about 75% by weight.

The SiO$_2$ component in glass contributes to a reduction in the thermal expansion coefficient. The MO component contributes to an increase in thermal expansion coefficient.

Including an appropriate amount of glass crystallized in the course of firing is preferable to obtain good mechanical strength properties. Thus, the glass composition is preferably close to the composition of crystallized glass. For example, in the MO—SiO$_2$—Al$_2$O$_3$—B$_2$O$_3$-based glass, MAl$_2$Si$_2$O$_8$ and MSiO$_3$ are readily crystallized. Thus, the ratio of SiO$_2$ to MO is preferably adjusted such that the glass has a composition similar to the crystal composition. Accordingly, the ratio of SiO$_2$ to MO in the glass composition of the surface portions 3 and 4 is preferably close to 2, for example, in order to reduce the thermal expansion coefficient. The ratio of SiO$_2$ to MO in the glass composition of the inner layer portion 2 is preferably close to 1, for example, in order to increase the thermal expansion coefficient.

The proportion of MO in the glass composition of the inner layer portion 2 is preferably greater than that of the surface portions 3 and 4, such that the inner layer portion 2 is susceptible to erosion by plating treatment after firing. However, the inner layer portion 2 is not exposed to the outside and thus is less subjected to fatal damage caused by the erosion.

To increase the difference in thermal expansion coefficient, an excessively high content of $SiO_2$ in the glass included in the surface portions 3 and 4 causes insufficient sintering due to an inadequately reduced glass viscosity. An excessively high content of MO results in an insufficient difference in thermal expansion coefficient.

Furthermore, to increase the difference in thermal expansion coefficient, an excessively high content of MO in the glass in the inner layer portion 2 causes insulation failure due to a reduced resistance to moisture. An excessively high content of $SiO_2$ results in an insufficient difference in thermal expansion coefficient.

Accordingly, the ratio of $SiO_2$ to MO in the glass included in each of the inner layer portion 2 and the surface portions 3 and 4 is preferably in the ranges disclosed above.

Glass included in the material defining the surface portions 3 and 4 more preferably includes about 34% to about 73% by weight of $SiO_2$, about 14% to about 41% by weight of MO, about 0% to about 30% by weight of $B_2O_3$, and about 0% to about 30% by weight of $Al_2O_3$, for example. In this case, glass included in the material defining the inner layer portion 2 preferably includes about 22% to about 60% by weight of $SiO_2$, about 22% to about 60% by weight of MO, about 0% to about 20% by weight of $B_2O_3$, and about 0% to about 30% by weight of $Al_2O_3$, for example. The reason for this is described below.

$B_2O_3$ functions an appropriate viscosity to glass such that sintering proceeds smoothly during firing. An excessively high amount of $B_2O_3$ results in excessive baking due to an excessively low viscosity, thereby forming pores on the surface which are likely to cause insulation failure. A reduction in the amount of $B_2O_3$ is likely to increase the viscosity, and thus, reduce sinterability. Thus, at least about 1% by weight of $B_2O_3$, for example, is preferably included.

$Al_2O_3$ functions as a component defining the crystallized phase in the surface portions 3 and 4. At an excessively high amount of $Al_2O_3$, the crystallization does not easily occur. At an excessively low content of $Al_2O_3$, the crystallization does not easily occur. Thus, at least about 1% by weight of $Al_2O_3$, for example, is preferably incorporated.

$Al_2O_3$ functions to improve the chemical stability of glass, thus improving the resistance to plating and moisture in the inner layer portion 2 having a relatively large MO content. $Al_2O_3$ provides an intermediate contribution between $SiO_2$ and MO to the thermal expansion coefficient. Thus, an excessively high amount of $Al_2O_3$ eliminates the difference in thermal expansion coefficient.

The material defining the surface portions 3 and 4 more preferably includes about 30% to about 60% by weight of an alumina powder as a filler, for example. The material defining the inner layer portion 2 more preferably includes about 40% to about 70% by weight of the alumina powder as a filler, for example. The reason for this is described below.

The alumina filler contributes to improved mechanical strength. An excessively low content of the alumina filler provides insufficient strength. In particular, when the inner layer portion 2 that is subjected to a tensile stress does not have sufficient mechanical strength, damage occurs at the inner layer portion 2. That is, the effect of the surface portions 3 and 4 reinforced by the compressive stresses is not sufficiently provided. Thus, the inner layer portion 2 has an alumina filler content greater than that of the surface portions 3 and 4 and has increased strength, so that the inner layer portion 2 can withstand a greater difference in thermal expansion coefficient. Therefore, the effect of the reinforced surface portions 3 and 4 is sufficiently provided.

The alumina filler provides an intermediate contribution between glass in the inner layer portion 2 and glass in the surface portions 3 and 4 to the thermal expansion coefficient. Thus, an excessively high content of the alumina filler eliminates the difference in thermal expansion coefficient.

Examples of the filler that may be included in the inner layer portion 2 include other ceramic powders, such as a zirconia powder, in addition to the alumina powder.

In the multilayer ceramic substrate 1, each of the surface portions 3 and 4 preferably has a thickness of about 5 μm to about 150 μm, for example. The reason for this is described below.

Stresses that occur due to the difference in thermal expansion coefficient act on the interfaces of the inner layer portion 2 and the surface portions 3 and 4. More specifically, compressive stresses act on the surface portions 3 and 4. Each compressive stress decreases with increasing distance from a corresponding one of the interfaces. Meanwhile, a tensile stress acts on the inner layer portion 2. The tensile stress decreases with increasing distance from a corresponding one of the interfaces. This is because the stresses are relieved with increasing distance. At a distance greater than about 150 μm, substantially no compressive stress acts on the surface. Thus, each of the surface portions 3 and 4 preferably has a thickness of about 150 μm or less, for example.

When each of the surface portions 3 and 4 has a thickness of less than about 5 μm, the inner layer portion 2 having reduced strength due to the occurrence of the tensile stress is located in the vicinity of a surface, i.e., located less than about 5 μm from the surface. Thus, damage is likely to occur at the inner layer portion 2 in the vicinity of the surface. That is, the effect of the surface portions 3 and 4 that is reinforced by the compressive stresses is not provided. Thus, each of the surface portions 3 and 4 preferably has a thickness of at least about 5 μm, for example.

Figure 2A:
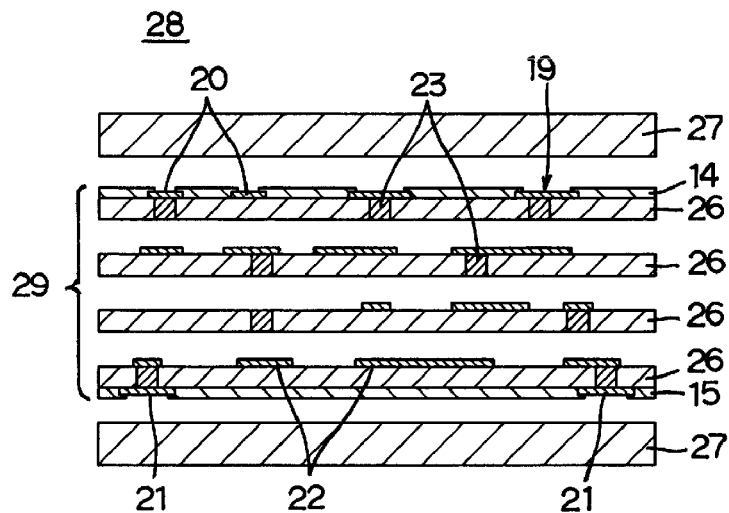
Figure 2B:
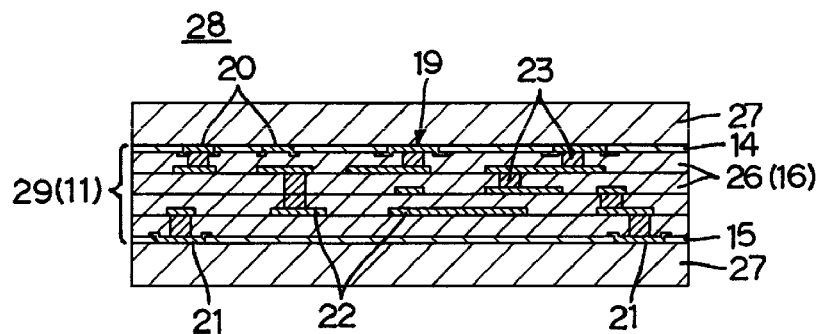
Figure 2C:
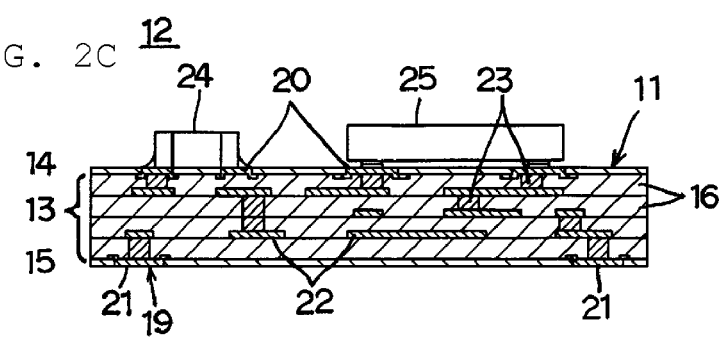

FIG. 1, which shows the multilayer ceramic substrate 1 described above, illustrates the basic structure of a multilayer ceramic substrate according to a preferred embodiment of the present invention. FIGS. 2A to 2C show a multilayer ceramic substrate 11 according to another preferred embodiment of the present invention and illustrate more specific structure of a multilayer ceramic substrate according to preferred embodiments of the present invention and a method for producing the multilayer ceramic substrate. FIG. 2C shows an electronic component 12 including the multilayer ceramic substrate 11. FIGS. 2A and 2B show states in the course of the production of the multilayer ceramic substrate 11 shown in FIG. 2C.

Referring to FIG. 2C, the multilayer ceramic substrate 11 has a laminated structure including an inner layer portion 13, a first surface portion 14, and a second surface portion 15, the inner layer portion 13 being arranged between the first and second surface portions 14 and 15 in the stacking direction. The inner layer portion 13 includes at least one inner ceramic layer 16.

The multilayer ceramic substrate 11 includes a conductive pattern 19 made of an Ag-based material. The conductive pattern 19 includes main-surface conductive films 20 and 21 arranged on main surfaces of the inner layer portion 13, a plurality of inner conductive films 22 arranged so as to define a passive element, e.g., a capacitor or an inductor, or to establish interconnection, such as electrical connection, for example, between elements in the inner layer portion 13, and a plurality of via conductors 23.

The first surface portion 14 covers the periphery of each of the main-surface conductive films 20 so as to leave the central portion of each main-surface conductive film 20 exposed. The second surface portion 15 covers the periphery of each of the main-surface conductive films 21 so as to leave the central portion of each main-surface conductive film 21 exposed.

Chip components 24 and 25 are mounted on one main surface of the multilayer ceramic substrate 11, the chip components 24 and 25 being electrically connected to the exposed central portions of the main-surface conductive films 20. Thereby, the electronic component 12 including the multilayer ceramic substrate 11 is produced. The main-surface conductive films 21 exposed at the other main surface of the multilayer ceramic substrate 11 define an electrical connection used to mount the electronic component 12 on a motherboard (not shown).

The foregoing multilayer ceramic substrate 11 is preferably produced as follows.

Referring to FIG. 2A, a glass-ceramic paste including glass and a ceramic powder for forming the surface portions 14 and 15 is prepared. In a more specific preferred embodiment, a glass-ceramic paste preferably including a $MO-SiO_2-Al_2O_3-B_2O_3$-based glass and an alumina powder, for example, is used. For example, glass ($CaO:SiO_2:Al_2O_3:B_2O_3=26:60:5:9$) and an alumina powder are preferably mixed in a weight ratio of about 60:40, for example. Then about 10 parts by weight of an acrylic binder and about 20 parts by weight of a solvent (terpineol) are preferably added thereto with respect to 100 parts by weight of the total amount of the glass and the alumina powder. The resulting mixture is preferably wet-mixed under predetermined conditions to produce a glass-ceramic paste.

A plurality of inner ceramic green sheets 26, which will define the inner ceramic layer 16, are prepared. For example, glass ($CaO:SiO_2:Al_2O_3:B_2O_3=45:45:5:5$) and an alumina powder are preferably mixed in a weight ratio of about 48:52. Then about 10 parts by weight of a butyral binder, about 3 parts by weight of a plasticizer, and about 10 parts by weight of a solvent (terpineol) are added thereto with respect to 100 parts by weight of the total amount of the glass and the alumina powder. The resulting mixture is wet-mixed under predetermined conditions to form a slurry. The inner ceramic green sheets 26 each preferably having a thickness of about 50 μm, for example, can be produced from the slurry.

In this preferred embodiment, constraining ceramic green sheets 27 are prepared, the ceramic green sheets 27 including an inorganic material that is not sintered at a temperature at which the glass-ceramic paste and the inner ceramic green sheets 26 described above are sintered. For example, an alumina powder is mixed with an organic solvent. Then about 10 parts by weight of a butyral binder and about 3 parts by weight of a plasticizer are added thereto with respect to 100 parts by weight of the alumina powder. The resulting mixture is wet-mixed under predetermined conditions to form a slurry. The constraining ceramic green sheets 27 each preferably having a thickness of about 100 μm, for example, can be produced from the slurry.

A conductive paste for forming the conductive pattern 19 including the main-surface conductive films 20 and 21, the inner conductive films 22, and the via conductors 23 is prepared. The conductive paste preferably includes, for example, about 70% by weight of an Ag powder, about 10% by weight of an acrylic resin, and about 20% by weight of a terpineol solvent. Alternatively, in place of the Ag powder, an Ag/Pd mixed powder may be used.

The conductive pattern 19 is formed with the conductive paste on the resulting ceramic green sheets 26 defining the inner layers. More specifically, the main-surface conductive films 20 and 21, the inner conductive films 22, and the via conductors 23 are formed on specific inner ceramic green sheets 26, as necessary.

The glass-ceramic paste is applied to outward facing surfaces of the outermost sheets of the inner ceramic green sheets 26, thereby forming the surface portions 14 and 15. The surface portions 14 and 15 are formed so as to cover the periphery of each of the main-surface conductive films 20 and 21 and leave the central portion of each of the main-surface conductive films 20 and 21 exposed. Each of the surface portions 14 and 15 preferably has a thickness of, for example, about 10 μm.

These elements described above are stacked in the order and the direction shown in FIG. 2A. The resulting stack is pressed with a press machine to produce a composite laminate 28 shown in FIG. 2B. At this point, exposed portions of the main-surface conductive films 20 and 21 and outward facing surfaces of the surface portions 14 and 15 are planarized by pressing, so that the exposed portions of the main-surface conductive films 20 and 21 are substantially flush with the outward facing surfaces of the surface portions 14 and 15, respectively. Although four sheets are shown for the inner ceramic green sheets 26, in practice, for example, about 20 sheets are stacked. The composite laminate 28 includes a laminate 29 to be formed into the multilayer ceramic substrate 11, the laminate 29 being arranged between the constraining ceramic green sheets 27.

Next, the composite laminate 28 is preferably fired at about 900° C., in a firing step. For example, a temperature of about 870° C. is maintained for about 10 minutes in the firing step. During the firing step, the constraining ceramic green sheets 27 constrain the shrinkage of the laminate 29 in the planar direction. When the firing step is completed, the laminate 29 in the composite laminate 28 is sintered to form the multilayer ceramic substrate 11, and the constraining ceramic green sheets 27 are formed into unsintered porous portions. Removal of the unsintered portions with, for example, an ultrasonic cleaner results in the multilayer ceramic substrate 11 shown in FIG. 2C.

Subsequently, the chip components 24 and 25 are mounted on the multilayer ceramic substrate 11 as shown in FIG. 2C, thereby completing the electronic component 12.

The foregoing production method may be modified as follows.

In a first modification of the preferred embodiment of the present invention described above, the main-surface conductive films 20 and 21, the inner conductive films 22, and the via conductors 23 are formed on the inner ceramic green sheets 26, as necessary. These inner ceramic green sheets 26 are stacked to form the laminate 29. Then a glass-ceramic paste is applied to the outer surface of the laminate 29, thus forming the surface portions 14 and 15.

In a second modification of the preferred embodiment of the present invention described above, unlike the foregoing first modification, in order to form the surface portions 14 and 15, a glass-ceramic paste is applied on support films to form patterns to be formed into the surface portions 14 and 15. Then the patterns on the support films are transferred to the outer surface of the laminate 29.

In a third modification of the preferred embodiment of the present invention described above, the surface portions 14 and 15 are formed by transferring as in the second modification. In addition, the main-surface conductive films 20 and 21 are also formed by transferring.

In a fourth modification of the preferred embodiment of the present invention described above, instead of using the foregoing constraining ceramic green sheets 27, the laminate 29 is fired without the constraining ceramic green sheet.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
a laminated structure including an inner layer portion and surface portions in contact with main surfaces of the inner layer portion, the inner layer portion being arranged between the surface portions in a stacking direction; wherein
the surface portions have a thermal expansion coefficient less than that of the inner layer portion;
the surface portions are made of a glass-ceramic material including glass and a ceramic powder;
the inner layer portion includes a conductive pattern made of an Ag-based material;
the conductive pattern includes main-surface conductive films arranged on at least one of the main surfaces of the inner layer portion;
at least one of the surface portions covers peripheries of the main-surface conductive films from above so as to leave central portions of the main-surface conductive films exposed and such that the peripheries of the main-surface conductive films are disposed between the at least one of the surface portions and the inner layer portion.

2. The multilayer ceramic substrate according to claim 1, wherein the glass-ceramic material includes an $MO-SiO_2-Al_2O_3-B_2O_3$-based glass, where MO represents at least one selected from CaO, MgO, SrO, and BaO, and an alumina powder.

3. The multilayer ceramic substrate according to claim 1, wherein a difference in the thermal expansion coefficients between the inner layer portion and the surface portions is at least about 1.0 $ppmK^{-1}$; and a content of a component common to both a material defining the inner layer portion and a material defining the surface portions is at least about 75% by weight.

4. The multilayer ceramic substrate according to claim 3, wherein the difference in thermal expansion coefficient between the inner layer portion and the surface portions is about 4.3 $ppmK^{-1}$ or less.

5. The multilayer ceramic substrate according to claim 2, wherein the $MO-SiO_2-Al_2O_3-B_2O_3$-based glass includes about 34% to about 73% by weight of $SiO_2$, about 14% to about 41% by weight of MO, about 0% to about 30% by weight of $Al_2O_3$, and about 0% to about 30% by weight of $B_2O_3$.

6. An electronic component comprising the multilayer ceramic substrate according to claim 1.

* * * * *